United States Patent [19]

Heath

[11] Patent Number: 4,686,000

[45] Date of Patent: Aug. 11, 1987

[54] SELF-ALIGNED CONTACT PROCESS

[76] Inventor: Barbara A. Heath, 615 Hempstead Pl., Colorado Springs, Colo. 80906

[21] Appl. No.: 831,463

[22] Filed: Feb. 19, 1986

Related U.S. Application Data

[63] Continuation-in-part of Ser. No. 719,073, Apr. 2, 1985, abandoned.

[51] Int. Cl.⁴ .................... H01L 21/306; B44C 1/22; C03C 15/00; C03C 25/06
[52] U.S. Cl. ................................. 156/643; 156/644; 156/646; 156/653; 156/657; 156/662; 357/23.1; 357/41; 437/235; 437/241; 437/40
[58] Field of Search ................ 29/580, 589, 590, 591, 29/571, 576 W; 156/643, 644, 646, 653, 657, 659.1, 656, 661.1, 662; 427/88-90; 357/23.1, 41, 49, 59, 65, 71; 148/1.5, 187

[56] References Cited

U.S. PATENT DOCUMENTS

| | | | |
|---|---|---|---|
| 3,648,125 | 3/1972 | Peltzer | 317/235 |
| 3,849,216 | 11/1974 | Salters | 148/187 |
| 3,913,211 | 10/1975 | Seeds et al. | 29/571 |
| 3,936,858 | 2/1976 | Seeds et al. | 357/23 |
| 4,182,023 | 1/1980 | Cohen et al. | 29/571 |
| 4,210,993 | 7/1980 | Sunami | 29/571 |
| 4,271,582 | 6/1981 | Shirai et al. | 29/571 |
| 4,287,661 | 9/1981 | Stoffel | 29/571 |
| 4,292,728 | 10/1981 | Endo | 29/571 |
| 4,356,623 | 11/1982 | Hunter | 29/571 |
| 4,466,172 | 8/1984 | Batra | 29/571 |
| 4,486,943 | 12/1984 | Ryden et al. | 29/571 |
| 4,505,026 | 3/1985 | Bohr | 29/577 |
| 4,513,494 | 4/1985 | Batra | 29/576 B |

OTHER PUBLICATIONS

Hosoya, T., "A Self-Aligning Contact Process for MOS LSI," *IEEE Trans. on Electron Devices*, vol. ED-28, No. 1, Jan. 1981, pp. 77-82.

Kuninobu, S., "A New Self-Aligning Poly-Contact Technology for MOS LSI," *IEEE Trans. on Electron Devices*, vol. ED-29, No. 8, Aug. 1982, pp. 1309-1313.

Josquin et al., "The Oxidation Inhibition in Nitrogen-Implanted Silicon," *J. Electrochem. Soc.: Solid-State Science and Technology*, vol. 129, No. 8, Aug. 1982, pp. 1803-1811.

Tanigaki et al., "A New Self-Aligned Contact Technology," *J. Electrochem. Soc.* Solid-State Science and Technology, vol. 125, No. 3, Mar. 1978, pp. 471-472.

*Primary Examiner*—William A. Powell

[57] ABSTRACT

An improved process for self-aligned contact window formation in an integrated circuit leaves a "Stick" of etch stop on vertical sidewall surfaces to be protected. The technique includes, in the preferred embodiment, a layer of oxide over active areas and on top of the gate electrode of a transistor. The oxide is thicker on top of the gate electrode than over the active area. A silicon nitride layer acting as an etch stop is included between the oxide and interlevel dielectric such as BPSG. Contact windows may deviate from their intended position and partially overlie a poly edge such as a gate electrode or an isolation (field-shield) or field oxide edge. Two-step etching comprises first etching the BPSG down to the etch stop layer, then etching the etch stop and underlying oxide, leaving a "stick" of etch stop on the side of the layer to be protected. This process preserves for the second step of the etch the differential thickness ratio of the oxide over the gate electrodes as compared to the oxide over the active area. This process allows the simultaneous formation of self-aligned contacts to field oxide, field-shield, and gate electrode edges. It is independent of the type of gate dielectric, gate electrode material, and gate electrode sidewall processing.

10 Claims, 20 Drawing Figures

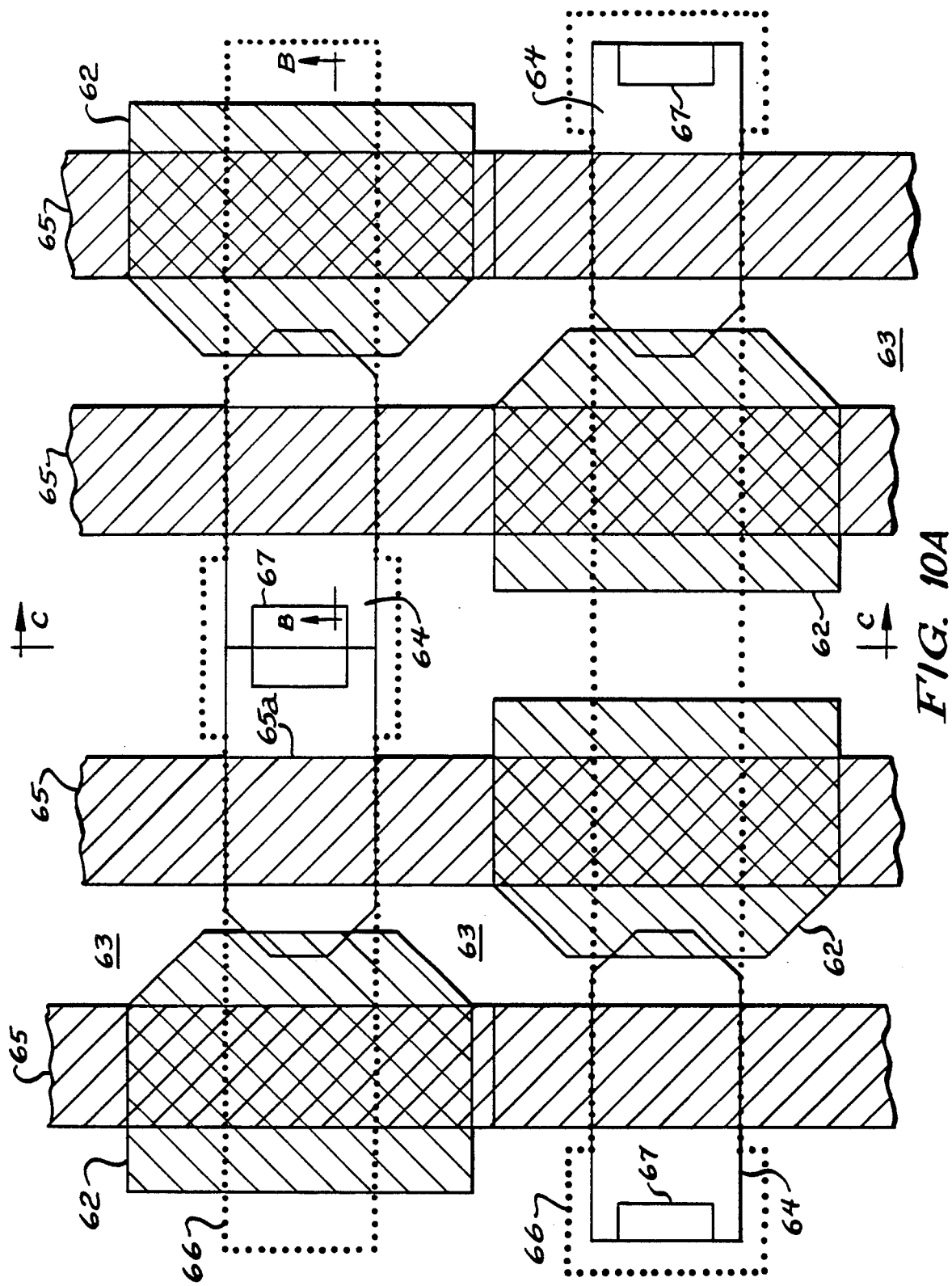

SELF-ALIGNED CONTACT PROCESS

This is a continuation-in-part of Ser. No. 719,073 filed in the U.S. Patent and Trademark Office on Apr. 2, 1985, now abandoned, the contents of which are hereby incorporated by reference.

BACKGROUND OF THE INVENTION

The present invention is concerned with semiconductor fabrication and particularly with design rules involving contact window placement and etching, as well as other aspects of the fabrication of integrated circuits.

A first problem which the present invention addresses relates to the fabrication of contact windows, which becomes a substantial problem in high-density integrated circuits. Integrated circuits are layered, having a silicon substrate, a first and sometimes a second layer of polysilicon thereover, and at least one layer of metal over that. Each of these layers is "defined" into circuit elements (such as lines). In order to provide electrical insulation between these various elements and layers, interlevel dielectric is used between the elements defined in the first (lowest or first deposited) polysilicon layer (poly I) and elements defined in the second polysilicon layer (poly II), between poly II and the elements defined in the first metal layer, and between elements defined in subsequent metal layers. Contact windows permit contacts between two layers or between a part of the substrate and a layer or element located above it.

One use for a contact window is to provide electrical contact with a source/drain region which has been formed in a substrate. Near the contact window there will generally be found another element such as a gate electrode, a field shield edge, or a field oxide edge. with the increasing density of integrated circuits, the geometries become smaller, and obviously the space separating the contact windows from nearby elements becomes less. To understand this problem, reference will be made to FIGS. 1A-1D.

FIG. 1A is a representational plan view of a contact window 1 which is placed on a source/drain region 2 (inside broken lines) which has been established within a substrate 3. Window 1 is located a distance d represented by an arrow 4 from an edge 5 which separates source/drain region 2 from isolation 6. Isolation 6 covers substrate 3 outside of the source/drain region 2. A polysilicon line 7 forms a gate electrode where it passes over an active area defined by edge 5. As illustrated in FIG. 1A, the contact window is an adequate distance d away from edge 5.

However, in FIG. 1B contact window 1 has not been aligned properly with respect to source/drain region 2. While it does predominantly lie upon region 2 and therefore will permit subsequently added metal to contact source/drain 2, window 1 has no separation from edge 5 and indeed is partially lying on top of isolation 6. Because the contact window is an etched opening which will be filled by a conductive metal, if part of isolation 6 (either a field shield gate electrode or the substrate underlying a field oxide) is exposed by contact window 1 as in FIG. 1B, then when the metal is added, isolation element 6 (or the material beneath it) will be shorted to the source/drain region 2 and to the metal interconnect. Obviously, this is to be avoided.

The problem is further illustrated in FIGS. 1C and 1D. A cross-sectional view along line A—A of FIG. 1B is shown in FIG. 1C where element 6 is shown illustratively as a field shield electrode 6a (defined in poly I) next to a source/drain region 2 in the substrate 3. (For a discussion of field shield electrodes, see U.S. Pat. No. 4,570,331 filed Jan. 26, 1984, Pat. No. 4,570,331, entitled "Thick Oxide Field-Shield CMOS Process" which is incorporated herein by reference). A gate electrode 7 (defined in poly II) is shown above and adjacent to source/drain region 2. Over substrate 3 and on top of field shield electrode 6a and gate electrode 7 is shown a representative thickness of oxide 8. Contact window 1 has been formed beneath an arrow 9 which represents the positioning of the contact window as set up by the fabrication equipment. It can be seen in FIG. 1C that part of field shield electrode 6a has been exposed by etching oxide 8 to create contact window 1. When metal is added, it will short electrode 6a to source/drain region 2. It will be apparent that, in the same manner, where contact window 1 is misaligned such that it lays over the edge of electrode 7, the edge of electrode 7 would be exposed by etching oxide 8 to open contact window 1, and again a short would occur.

A variation is shown in FIG. 1D, which is also a cross-sectional view along line A—A of FIG. 1B. However, in this case element 6 refers illustratively to a field oxide 6b next to source/drain region 2 in substrate 3. Gate electrode 7 next to the source/drain region 2 and oxide 8 are included. Contact window 1 has been formed beneath arrow 9 which represents the positioning of the contact window as set up by the fabrication equipment.

It can be seen in FIG. 1D that part of the field oxide 6b under arrow 9 has been removed by etching through oxide 8 to open contact window 1. (Dotted line 6' shows the original thickness of field oxide 6b before the contact window was etched.) Some field oxide 6b was removed because it cannot be distinguished during etching from oxide 8.

Integrated circuits are formed on large substrates (4" to 8" in diameter) which contain typically hundreds of circuits and typically million of contact windows. Since a material cannot be deposited or grown uniformly in thickness over such a large area (at worst ±10%), an overetch of 20% is common to insure that all contact windows on the entire substrate will be etched open.

In FIG. 1D the edge of field oxide 6b is tapered, as is common when the field oxide/active area pattern is formed by local oxidation of silicon. The misalignment of contact window 1 illustrated by arrow 9 has exposed the tapered thin edge 6bb of field oxide 6b to the contact window etch. Since the etch cannot distinguish between field oxide 6b and oxide 8 and an overetch is required or ordinarily employed, a region 3' of substrate 3 which does not include source/drain 2 has been exposed. When metal is added, it will short substrate 3 to source/drain region 2.

In current high density dynamic random access memories, a contact window will be on the order of 1.0 to 1.5 microns in length and width. Often it will be located on an active area next to a polysilicon word line and isolation edge, such as element 7 and line 5 in FIGS. 1A, 1B, 1C, and 1D. Perpendicular to the word line will be a bit line formed in an upper layer of metal. At this intersection of the bit line and word line will be a memory cell. The contact window will allow the metal from the bit line to contact the source/drain region. The contact window may be separated by only about 1 micron from the polysilicon word line and the isolation edge.

However, the size of the contact window 1 itself has tolerances in its fabrication so that its actual dimensions may be up to 0.5 microns larger than the specified dimension for the contact window. If the contact window is larger than specified, it will be closer to the polysilicon word line and the isolation edge.

Accordingly, it is necessary to locate the contact window so as not to cause a short. One commonly desires to align the contact window to some known edge, typically one edge of a gate electrode or an isolation edge (e.g., an edge of field shield 6a or field oxide 6b). However, there is a nonzero tolerance in aligning one level to the next level in forming an integrated circuit. This tolerance t (typically 0.5 microns for minimum feature sizes in the 1–2 micron range) is inherent in the wafer stepper equipment used for fabrication. If there were a misalignment of the contact window with respect to an isolation edge or other element, this could result in an undesired short unless there were a wide margin of error.

Consider with respect to FIG. 1A that contact window 1 is to be aligned with respect to a sharp edge in any given layer, for example, edge 5. To prevent contact window 1 from unintentionally contacting isolation 6 to the right of line 5 despite the position tolerance t, then the design rule for positioning the window would require it to be located nominally at a distance of at least t from edge 5.

The problem of alignment tolerance becomes more severe with the use of multiple layers. If a contact window is aligned to an element in Poly I, because there is a similar tolerance t also between poly I and poly II, there will be an even larger uncertainty (slightly less than 2t) of the location of the contact window with respect to the elements formed in Poly II. Similarly, if the contact window is aligned to an element defined in the substrate such as a field oxide edge, there will be an uncertainty of approximately 2t in the placement of the contact window with respect to the edge of poly I and poly II (provided they are both aligned to the field oxide edge). In practice, the contact windows are aligned to the most critical layer, with a distance separating the contact from elements defined in that layer of greater than t. The distance separating the contacts from elements formed in other layers is then much larger than t.

Considering all of these tolerances, then, in order to ensure that the metal does not short to any polysilicon feature or the substrate through the contact window, wide margins would be necessary between contact windows and nearby elements. This would increase the size of the integrated circuit significantly, resulting in fewer die per wafer and lower yield.

Such design rules, imposed by the tolerance obtained on optical alignment equipment and in the fabrication process, lead to wasted or unnecessarily large chip areas. These design rules prevent designs from being scaled as aggressively as posssible. A design rule requiring an active area opening to be large could be relaxed if it were possible to provide self-alignment of the contact window with respect to a nearby element to which contact is to be avoided. In other words, it would be advantageous to permit variation in the position of a contact window with respect to the edge of active area or source/drain, even to the extent of allowing it to overlap a polysilicon or other element, provided that there would be not short circuit occasioned by the overlap. Some technique to prevent such shorting would be highly desirable, but no solution suitable for aligning contact windows to gate electrode edges or isolation edges for a VLSI process has come forth.

One possible solution referred to in Batra U.S. Pat. No. 4,466,172 has been devised for self-aligning contact windows to polysilicon gate electrodes. This involves using a nitride/oxide gate dielectric so that oxidation of the polysilicon gate electrode can be achieved with oxide grown on the tops and sides of the polysilicon elements and not on the source and drain regions of the substrate. An etch stop layer of nitride is then added over the structure and interlevel dielectric is then deposited. Contact windows are patterned and etched down to the nitride etch stop layer. Then the etch stop layer is removed where exposed by the contact window. Then the oxide over the source/drain is removed and metal is deposited. The differential between the thickness of oxide on the source/drains versus that on the top and sides of the polysilicon gate electrode results in contact being made to the source/ drain region but not to the polysilicon gate electrode.

However, the use of this approach has been forestalled in fabricating circuits of VLSI dimensions for several reasons. First, the use of nitride/oxide under the gate electrode is not common and is usually not desirable for standard n-channel, p-channel, and CMOS processes. Such a nitride/oxide gate dielectric is used in the prior art to prevent oxidation of the source/drain region while a thick oxide, of "critical importance" (Batra, col. 3, line 6) is grown on the top and sides of the polysilicon electrode. This thick oxide protects the gate electrode from making contact with the metal.

However, this oxide is subjected to hydrofluoric acid (HF) during the removal of the gate oxide. It is well known that oxides grown on polysilicon when subjected to HF solution have a much increased pinhole density over those same oxides as grown. These pinholes will result in shorts between the metal and polysilicon when the metal is added. In addition, VLSI circuits are frequently fabricated with gate electrode materials which are not conveniently oxidized, such as polycide structures and silicides. This raises a problem for the Batra process. Also, transistor structures optimized for 1 micron and submicron channel lengths, such as lightly doped drain structures, require sidewall spacers which are not generally grown but are deposited and are of a specific thickness (0.1–0.5 microns) determined from the desired device characteristics. These sidewall spacers are probably inadequate to prevent metal to gate shorts. The use of the Batra process is not compatible with the formation of these devices. Finally, for transistors in the VLSI regime (under 2 micron poly width) the sidewall oxide required by Batra consumes too much space. Hence, no manufacturable, commercially acceptable process is apparent for permitting self-aligned contact windows in such structures. Aggressive design rule scaling with respect to contact window spacing is not possible when thick interlevel dielectric is used.

One object of this invention therefore is to provide a self-aligned contact process which is independent of gate dielectric type.

Another object of the present invention is to provide a process for self-aligned contacts in a VLSI circuit which is independent of sidewall processes (on the gate electrode) used to optimize device performance. For example, the process should tolerate the absence of unnecessary or undesirable oxide on the sidewalls (unlike Batra). Presently, it is undesirable to oxidize some polycide gate electrodes such as titanium silicide. The process should also tolerate, on the other hand, the addition of any amount of oxide to the sidewall for any purpose such as isolation from a later established interconnect or other element, or the addition of any material to the sidewall for the purpose of providing a spacer to fabricate optimized VLSI transistor structures such as double diffused drain or lightly doped drain devices.

Therefore, another object of the present invention is to provide a process for locating and etching contact windows in transistors without imposing a design rule requiring wasted silicon area, and which can be applied to all gate and field oxide or field shield edge simultaneously.

Another object of the invention is to provide a technique for self-aligning contacts in a semiconductor structure despite the use of interlevel dielectric, which ordinarily is relatively thick.

A further object is to provide a method which permits reliable etching of the contact window despite tolerances in its placement, without jeopardizing the integrity of the memory cell, transistor or other device.

SUMMARY OF THE INVENTION

These and several other objects and advantages are obtained by providing a self-aligned contact process which involves establishing gate electrodes and/or isolation edges which are substantially vertical with respect to the substrate surface, protecting the tops of these elements with an insulating oxide, protecting the top and sides of these structures with a layer to serve as an etch stop, and removing the etch stop in an anisotropic manner, so as not to remove the etch stop from the sidewalls of the gate electrodes or isolation edges. Such etch stop is established between the relatively thick interlevel dielectric and the oxides covering the gate electrode and substrate. The etch stop preferably is silicon nitride. This permits the nominal position of the contact window over the active area to be relatively independent of design rules which would otherwise prescribe a relatively large distance between a poly edge or field oxide edge and the nearest edge of the contact window. This results in self-alignment, wherein the contact window location due to tolerance in the fabrication equipment may partially overlap a gate electrode or isolation edge such as the edge of field oxide or a field-shield edge. Despite this departure from the nominal or ideal location, the contact window can be formed without undesirable short circuits.

This is done illustratively by fabricating the poly edge or field oxide edge to be substantially vertical, and by providing an oxide covering over only the top of the poly element. Thereafter the etch stop material is deposited followed by the interlevel dielectric. Subsequently, the contact window is etched down to the etch stop. Thereafter, the exposed portion of the etch stop on top of the element to be protected is removed from the partially completed contact window in a manner so as to leave a "stick" of etch stop on the side of said element. In the case of self-alignment to a gate or field-shield transistor electrode edge, subsequent processing makes use of the relative thickness differences between the oxide covering the gate electrode as compared to the oxide over the active area to permit overetching in the contact window without etching entirely through the oxide covering the gate electrode or other element to which contact is not to be made. The "stick" of etch stop and any "stick" of interlevel dielectric remaining after the etch stop layer is removed protects the side of the element. In the case of a field oxide edge, subsequent processing makes use of the relative different in thickness between the field oxide and the oxide covering the active area to permit overetching of the contact window without etching entirely through the oxide covering the field region. As shown below, the requirement that the field oxide edge be vertical can be relaxed somewhat depending on the extent of the diffusion of the source/drain implant underneath that edge. Thus metallization can be added, and contact can be made to the source/drain region without shorting to the top or edge of a polysilicon element or the substrate under the edge of a field oxide.

The extra layer added for the purpose described above will act as an etch stop in that it etches much slower than the interlevel dielectric above it. Silicon nitride is preferred for a variety of reasons, but one could use another material. One material which may work as an etch stop is aluminum oxide. Other substances may be useful for the process, as long as they can be used as an etch stop for the interlevel dielectric, are insulators, and can be removed in subsequent process steps.

The present invention is applicable to single and double poly processes, single and multilevel metal processes, processes using polycide, and processes using conventional local oxidation isolation, field-shield isolation, and other schemes including reduced bird's beak isolation schemes (e.g., sealed interface local oxidation). It is applicable to aligning contacts to Poly I, Poly II, isolation edges such as an edge of field oxide, or other edges. It applies to PMOS, NMOS, CMOS, and other integrated circuit technologies. It is especially useful in fabricating CMOS RAMS which are 256K or larger.

BRIEF DESCRIPTION OF THE DRAWINGS

In describing the present invention, reference is made to the accompanying drawings wherein:

FIG. 3 shows two polysilicon gate electrodes on a susbstrate, covered by oxide;

FIG. 4 shows a contact opening cut through photoresist to the right gate electrode of FIG. 3 and shows ion implanted source and drain regions in the active area of the substrate, after heat driving;

FIG. 5 shows an etch stop in layer form covering an intermediate, partially complete structure;

FIG. 6 shows an interlevel dielectric layer over the etch stop layer;

FIG. 7 shows the structure of FIG. 6 after it has been etched through contact windows to the etch stop layer, and shows in dotted lines the further etching to be done by a different etchant (in the preferred embodiment);

FIG. 10A is a plan view of some DRAM memory cells fabricated with a double poly field-shield process and the present invention;

DETAILED DESCRIPTIONS

The following descriptions are illustrative of fabricating contact windows including, as part of the method, providing a layer of material to be used as an etch stop.

Applications Of Self-Aligned Contacts To Gate Or Field-Shield Edges

Figure 2:
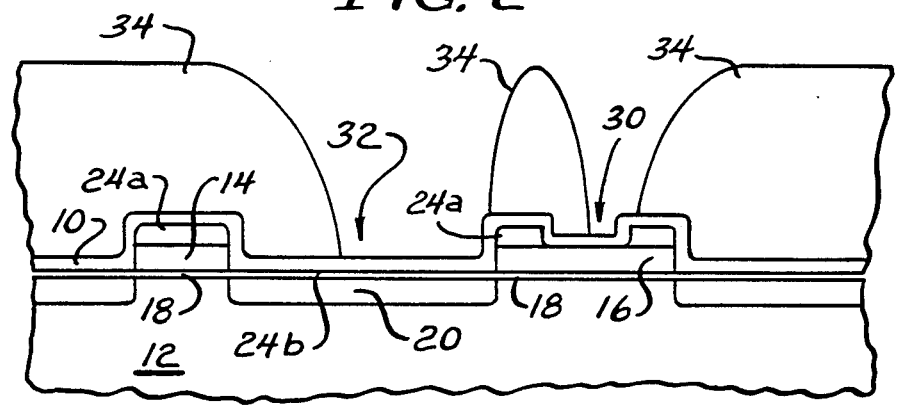
FIG. 2 is a cross-sectional illustration showing one illustrative structure according to various aspects of the present invention.

FIG. 2 shows an illustrative semiconductor structure near the completion of processing according to the invented process applied illustratively for establishing a self-aligned contact window to a gate electrode or field-shield electrode edge. The structure is fabricated with, for ease of explanation, a single poly process. Use of the invention with other processes will be described subsequently.

FIG. 2 illustrates a layer 10 operable as an etch stop and a substrate 12 having poly gate electrodes 14 and 16 over a relatively thin gate oxide 18. Between the gate electrodes but in the substrate is an arsenic, phosphorous or boron implant 20 which acts as a transistor source or drain. Between layer 10 and the gate electrodes 14, 16 is a layer of oxide 24 having a relatively thick portion 24a and a relatively thin portion 24b (on the order to 100 to 300 angstroms). Over gate electrode 16, the oxide has a recess for a window 30 to permit contact to the gate electrode. A further contact window 32 is shown between gate electrodes 14 and 16 to permit contact to the source or drain. A very thick BPSG (borophosphosilicate glass) dielectric 34 covers the layer 10 except in contact windows 30 and 32. This structure of FIG. 2 is ready for etching through etch stop layer 10 in openings 30 and 32 and etching through thin oxide 24b at opening 32 to open a contact window. The process for producing this structure, or a closely related one, will now be explained.

Figure 3:
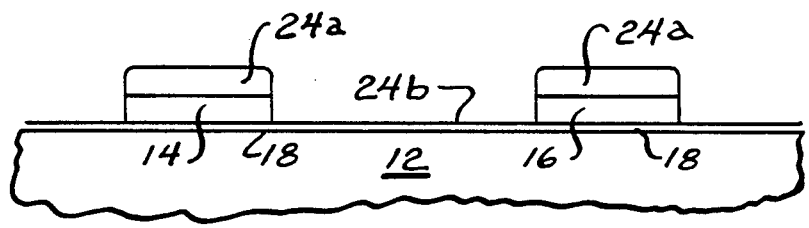
FIGS. 3-7 relate to the fabrication of the structure shown in FIG. 2. Of these.

Referring now to FIG. 3, on a silicon substrate 12, a thin layer of gate oxide 18 is grown, and then a layer of polysilicon is deposited and doped. Oxidation of the poly occurs next to create a relatively thick (illustratively 3000 angstroms) oxide over the polysilicon layer. The definition of the polysilicon next occurs to result in the formation of a transistor gate electrode, leaving some of the gate oxide 24b in the source/drain regions. Illustratively, each gate electrode 14, 16 has a thickness of about 3000 angstroms, the gate oxide 18 below the gate electrode has a thickness of about 300 angstroms, and the oxide 24a over the polysilicon has a thickness of about 3000 angstroms. Illustratively, the oxide 24b over the source and drain regions has a thickness of about 100 to 200 angstroms. Then source and drain implants of arsenic, boron or phosphorous are done, using such masks as customary to those skilled in the art. The implants impinge upon and enter the substrate. Next, the implants 20 are activated and are heat driven laterally and downward, as shown in FIG. 4.

Figure 4:
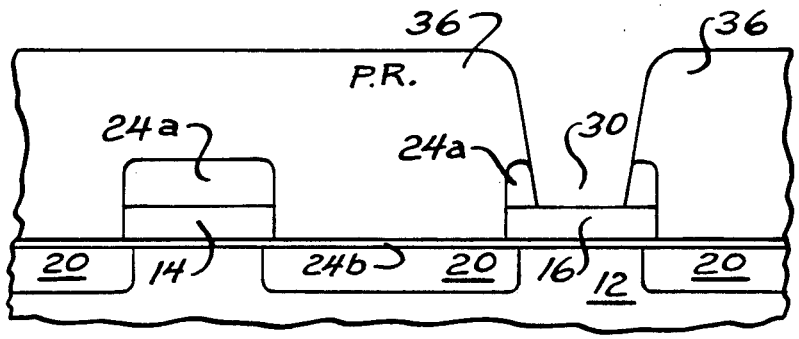

Referring further to FIG. 4, the next step is to mask contacts to polysilicon gate electrode 16 with openings in a photoresist 36 so that oxide 24a can be etched selectively down to the gate electrode. This will result in the contact window 30. This etching process can be a selective dry etch using a standard process in a plasma, reactive ion or reactive sputter etch apparatus with a fluorocarbon gas mixture. A Plasmatherm PK or Lam 590 plasma etcher would be suitable. The photoresist 36 is then removed from the structure.

Figure 5:
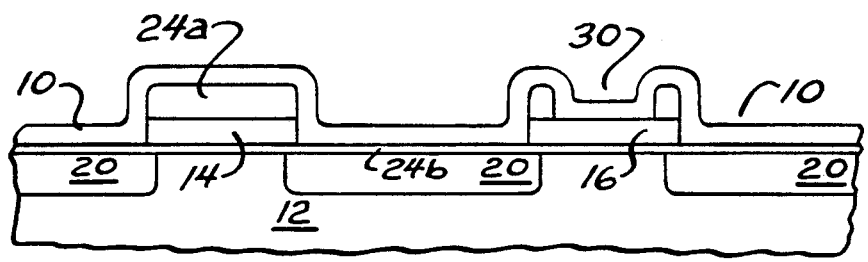

Turning to FIG. 5, etch stop layer 10 is added to this intermediate, partially complete structure. Preferably this is a layer of silicon nitride ($Si_3N_4$) which is put on by a chemical vapor deposition using Silane ($SiH_4$) or dichlorosiliane ($SiH_2Cl_2$) with ammonia ($NH_3$). This is heated in a furnace tube to about 700° C. to react the component gases. The deposition is allowed to occur until a layer 10 having a thickness of about 1000 angstroms is obtained. Other material can be used which has insulating properties, can be used as an etch stop for interlevel dielectric, can be subsequently removed selectively and anisotropically with respect to the interlevel dielectric, and can be left in the structure without causing subsequent processing or reliability problems. Silicon nitride is preferred, but other applications may make use of $Al_2O_3$. FIG. 5 shows the etch stop layer 10 at this stage of processing.

Figure 6:
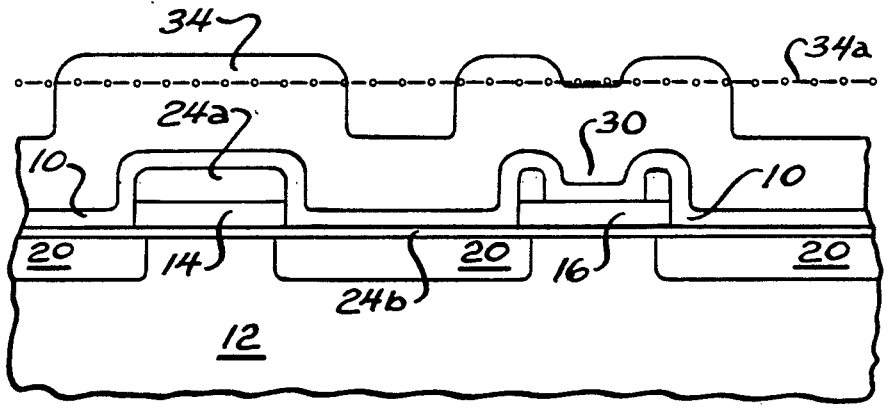

Turning to FIG. 6, an interlevel dielectric layer 34, such as about 7000 to 9000 angstroms of BPSG, next is added on top of the structure. FIG. 6 illustrates a structure at this stage of processing. At this stage, interlevel dielectric layer 34 can be conformal, or can be reflowed if a substantially flat surface is required, such as when multiple levels of metal will subsequently be used. Line 34a shows the top surface of BPSG 34 under these conditions.

Following this, a masking is done for the contact window to the poly electrode 16 and the contact window to the source or drain region 20 between the two electrodes 14 and 16. The contact window 32 will be self-aligned with respect to the polysilicon gate electrodes 14, 16 which have an oxide 24a thereover which is thicker than the oxide 24b covering the source/drain 20. Because contact window 32 will be self-aligned with respect to the polysilicon electrodes, in setting up its position in the fabrication process, it can be aligned to another edge, such as, in the case of a single poly process, the edge of an isolation oxide (not shown in FIGS. 2-7). In the case of a double poly field-shield process, the contact window can be aligned to the edge of the poly II active transistor gate electrode. In the case where a nearly vertical field isolation edge or field-shield isolation is used, or all poly layers have a thick oxide on top, alignment can be made to any convenient level because self-aligned contacts will be made to the isolation and all poly levels with this process.

Next, using a first etchant, the BPSG interlevel dielectric 34 is etched to the etch stop layer 10, layer 34 is then reflowed, and using a second etchant, layer 10 and the oxide 24b therebelow are then etched.

Preferably these etching steps are done by dry etching alone. The first etchant will etch the BPS 34 anisotropically and selectively with respect to the nitride etch stop layer 10. The first dry etch can occur illustratively in a Lam 590 etcher using CHF$_3$ at 60 SCCM, CF$_4$ at 30 SCCM, and He at 110 SCCM. The second etchant must be anisotropic and will etch layer 10 and underlying oxide 24b and will etch the BPSG somewhat. The second etchant is selective with respect to single crystal silicon. The second dry etch can occur in, for example, an Applied Materials model 8110 etcher using O$_2$ and CHF$_3$. A PK or Lam etcher could be used alternatively. However, for the first step, dry etching through the first 80 percent and then wet etching the remaining 20 percent of a dielectric layer 34 with a 30 percent overetch is acceptable if no dry etch selective for interlevel dielectric layer 34 over etch stop layer 10 is available. The wet etch can be 48% hydrofluoric acid diluted 7:1 by volume. This will result in a somewhat isotropic etch.

Figure 7:
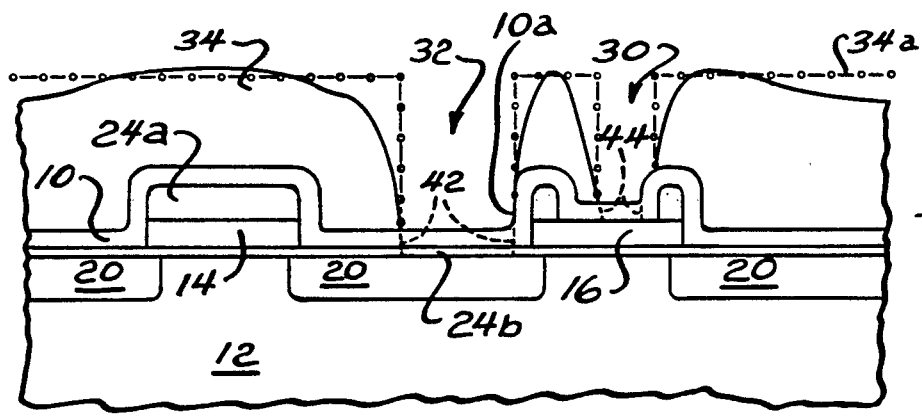

The etching in any event will etch the part of layer 10 in FIG. 7 generally between lines 42 for opening a contact window to the source/drain region 20. A portion 10a of layer 10 will remain on the sidewall of gate electrode 16, regardless of whether electrode 16 is polysilicon alone or is "polycide", i.e., has a silicide on top of it. (Portion 10a can be referred to as a "stick" and is shown more clearly in FIG. 8B.) Also, the part of layer 10 between lines 44 will be etched to open a contact window to poly electrode 16. Before the second etch, the BPSG can be relowed giving the shape of layer 34 shown in solid lines in FIG. 7. If the BPSG was reflowed prior to the etch as described supra, its shape will be as shown by line 34a. After the nitride and underlying oxide in the source/drain regions are etched, the final top layers of the semiconductor structure can be added. This typically is an aluminum alloy layer or member making contact with the selected areas of a source/drain and gate electrode. Alloy and passivation may now be done.

Figure 8A:
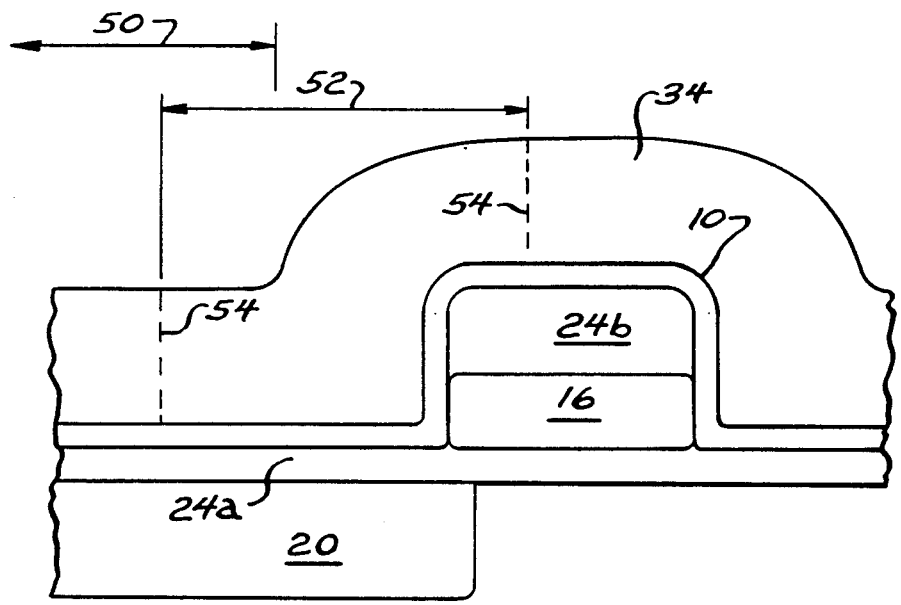
FIGS. 8A, 8B and 8C show, in expanded scale, how the present invention permits a contact window for the source or drain to be located partially over gate or field-shield electrodes, without leading to a short to the gate or field-shield electrodes.
Figure 8B:
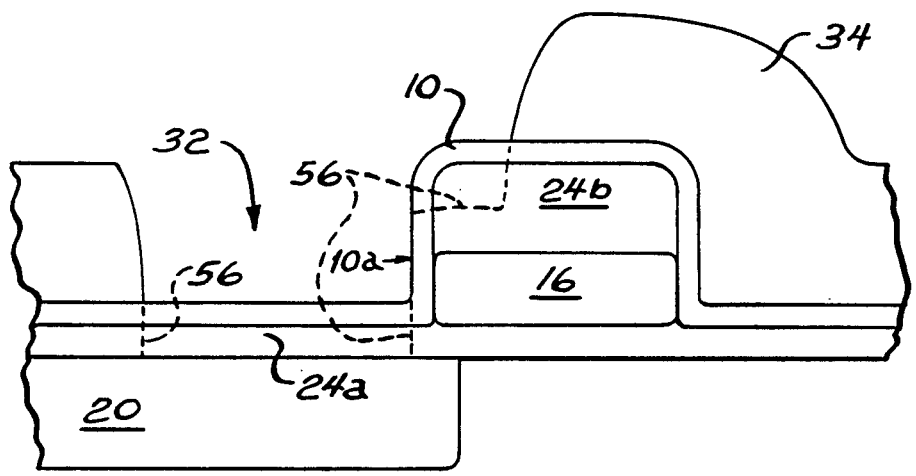
Figure 8C:
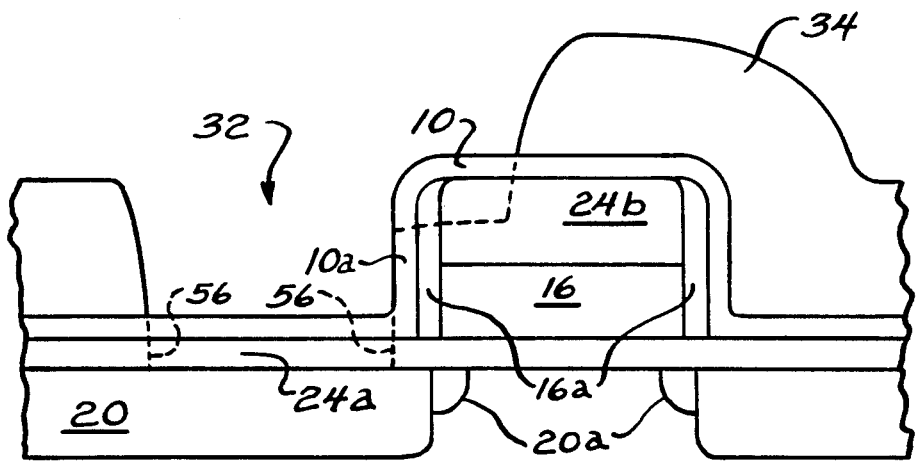
Figure 9A:
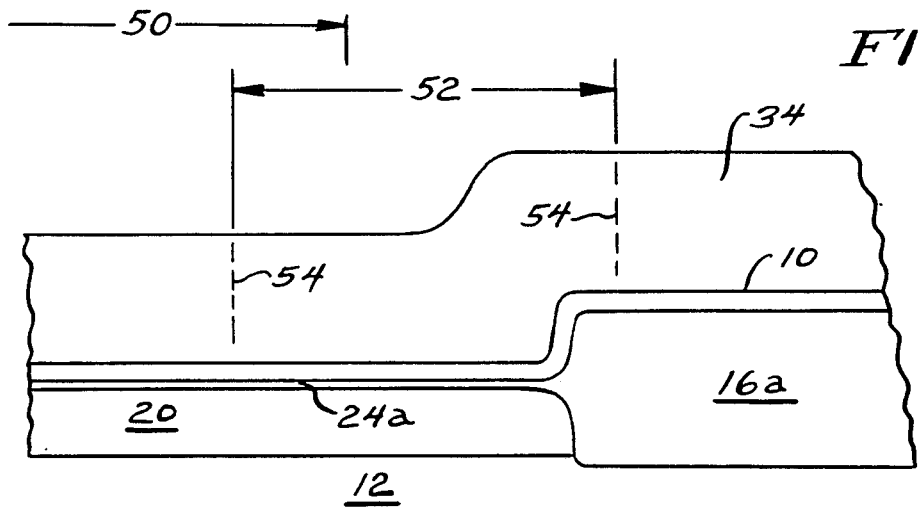
FIGS. 9A and 9B show, in expanded scale, how the present invention permits a contact window for the source or drain to be located partially over a field oxide edge, without leading to a short to the substrate underlying the field oxide.
Figure 9B:
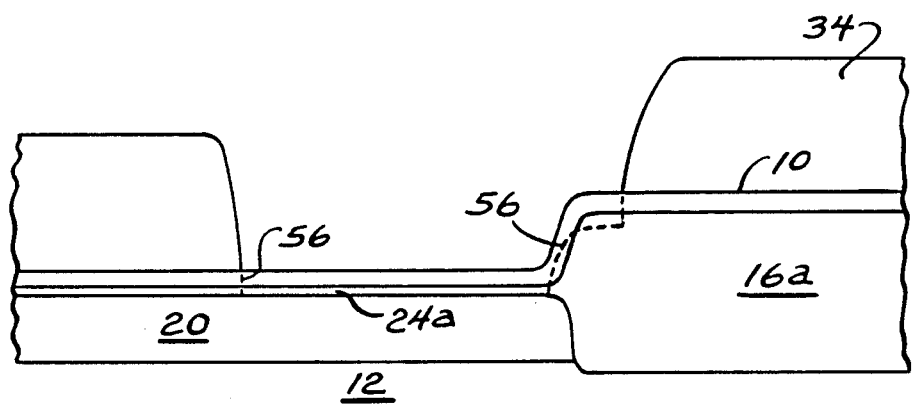

FIGS. 8 and 9 illustrate in expanded view the result of this embodiment of the invented process when a misalignment of the contact window occurs. FIGS. 8A, 8B and 8C relate to establishing a contact window to a source/drain region next to a gate electrode or field-shield electrode 16, and FIGS. 9A and 9B relate to establishing a contact window to a source/region next to field oxide 16a.

FIGS. 8A and 8B show a gate electrode 16 and an active area 20 in the substrate to the left of gate electrode 16. Oxide layer 24 covers the active area 20 and the top of gate electrode 16. It is relatively thin over the source/drain 20 as shown at 24a, but is relatively thick on the top of gate electrode 16, as shown at 24b.

A contact window is to be opened to the active area 20. In its ideal position, the contact window will be below the location designated by an arrow 50, but because of tolerances in the equipment, the masks are actually set up to etch the region below an arrow 52 which is displaced to the right from arrow 50. It will be seen that arrow 52 partially overlies gate electrode 16. Consequently, etching will occur first along dotted lines 54, and the part of interlevel dielectric layer 34 between lines 54 will be etched away using the etchant described supra. Such etching will stop when its reaches nitride layer 10. The solid lines in FIG. 8B show the process at this stage, after the first etching step.

Next, the etchant is changed as described supra, and the part of layer 10 between dashed lines 56 is removed, leaving the vertical "stick" 10a of layer 10. Also, the etch continues downward through the then-exposed parts of oxide 24a and 24b. Because oxide 24b is thicker than oxide 24a, the etch will not reach gate electrode 16. Some oxide 24b will remain on the top of gate electrode 16 even after the etch exposes the source/drain region 20 within the contact window, and because the nitride removal is anisotropic, the "stick" 10a will remain on the side, so no short to electrode 16 can occur.

The invented process can be used to protect a gate electrode when there is a sidewall spacer, which can be used to obtain a lightly doped drain. FIG. 8C shows a cross section at the same stage of processing as FIG. 8B but with an n-channel lightly doped drain transistor structure. This structure results from implantation techniques combind with the addition of a sidewall spacer 16a. The spacer is formed after the source/drain implant 20a, a "light" doese implant (generally between $5 \times 10^{12}$ and $5 \times 10^{13}$ ions/cm$^2$), but before the heavy source/drain implant 20 (illustratively $6 \times 10^{15}$ ions/cm$^2$). In this case, spacer 16a formed illustratively of oxide, is 0.1–0.3 μm thick and remains in the structure after completion of the circuit. The thickness of spacer oxide 16a is determined by considerations of optimized device performance. It may or may not be thick enough to provide reliable insulation between gate electrode 16 and metal subsequently deposited in contact window 32. Alternatively, the structure may be formed in such a way that the spacer is removed prior to contact formation, leaving no material on the sidewall of gate electrode 16. Many methods may be used to produce a transistor structure which has source/drain implants like those shown in FIG. 8C. Any method of forming this structure is acceptable when the present invention is used, because the present invention in its preferred form provides adequate insulation between gate electrode 16 and subsequently deposited metal by leaving the "stick" 10a of layer 10 of protect the sidewall of the gate electrode. Thus, variations in the processing of the sidewall of the gate electrode are not determinative of the isolation of the gate electrode from the subsequently deposited metal or another conductive layer with the use of the present invention. This leads to an increased flexibility over the prior art in the fabrication of transistors when using self-aligned contacts.

The process for self-aligned contacts described herein regarding gate electrodes or field-shield edges will also maintain the integrity of active areas in the device near field oxide edges. FIGS. 9A and 9B show a field oxide 16a next to an active area 20 in a substrate 12. Field oxide 16a has been prepared in a manner such that its edge is substantially vertical. This "reduced bird's beak" can be achieved by SILO (sealed interface local oxidation) or any other method. An oxide layer 24a extends over the top surface of active area 20. As in FIGS. 8A and 8B, a contact window 32 to source/drain 20 has been located at the position designated by arrow 52, which overlaps the left edge of field oxide 16a due to misalignment. Again etching occurs first along dotted lines 54 as described supra. The etching will stop when the etchant reaches nitride layer 10. The solid lines in FIG. 9B show the process at this stage, after the first etching step.

Next, the etchant is changed as described supra, and the part of layer 10 between the dashed lines 56 is removed. Also, the etch continues downwards into the then exposed parts of oxides 24a and 16a. Because the edge illustrated at the left side of oxide 16a is substantially vertical and in contact with the source/drain region 20, the removal of some oxide 16a by the etch process in that region will not result in a short of metal to substrate 12. The degree of verticality required for the edge of oxide 16a is determined by the depth of the source/drain implant before metalization. The shallower the source/drain, the more vertical is the requirement for the field oxide edge.

As a result of the process described with reference to FIGS. 8 and 9, the contact window to the active area will be self-aligned, i.e., it will be protected from shorting to an element nearby to which contact is not to be made. Accordingly, a design rule can be used which permits misalignment, overlap, or deviation within a tolerance of a contact window from an ideal position, despite the fact that thick interlevel dielectric is placed on top of the poly elements. This achieves the main object of the invention and permits aggressive scaling as needed in 256K (or larger) RAMS. The contact windows can be located substantially closer to poly edges or field-shield or isolation edges than heretofore. Deviations from nominal position due to normal tolerances in fabrication equipment can be permitted without causing inadvertent short circuits which prevent proper operation of the circuit. As a result, silicon area can be used much more efficiently. Further, nitride is not used as gate dielectric.

Thus, to summarize this illustrative embodiment of the invented process applied to a single poly N-channel system, one set of steps may occur as follows:
1. grow thin oxide on silicon substrate;
2. deposit, dope and oxidize polysilicon;
3. pattern and etch oxide and underlying polysilicon I, leaving some gate oxide in active area regions;
4. implant source and drain impurities and heat drive;
5. mask and etch contact windows through oxide to poly I gate electrode but not source/drain regions;
6. deposit nitride layer;
7. deposit BPSG (density and reflow);
8. mask contact windows to Poly I gate electrodes and source/drain regions;
9. etch through BPSG to nitride layer;
10. (densify and relow BPSG;)
11. etch anisotropically through nitride layer and underlying oxide to source/ drain and poly I gate electrode, leaving a "stick" of etch stop; and
12. add metal or other conductive material for interconnects.

Briefly, one way in which the invented process can be applied to a single poly system using silicide in a CMS system is as follows:
1. grow thin oxide on silicon substrate;
2. deposit and dope polysilicon;
3. deposit silicide and oxide, mask, etch and anneal oxide/silicide/poly layer, leaving some gate oxide in the active area regions;
4. mask for N channel source/drain implants;
5. implant arsenic or phosphorous for N channel source/drain and heat drive if desired;
6. mask for and implant P channel source/drain implants;
7. mask and etch contact windows to silicide/poly layer but not source/drain regions;
8. deposit nitride layer;
9. deposit BPS (densify, reflow and activate implants);
10. mask contact windows to silicide/poly electrode and source/drain regions;
11. etch through BPSG to nitride layer;
12. (densify and reflow BPSG and activate implants;)
13. etch through nitride layer and underlying oxide to source/drain and silicide, leaving a "stick" of etch stop;
14. add metal or other conductive material for interconnects.

As mentioned, the process is useful in double poly systems. In such a case, it is preferred to grow a thin oxide on the sides of poly I to prevent shorts between poly I and poly II. This oxide, preferably about 500A thick, is not required to make self-aligned contacts. In view of the foregoing lengthy descriptions, it will suffice to outline the steps of an illustrative method for double polysilicon technology. Moreover, it will be understood that either of the poly levels can optionally be polycide. Briefly, the process steps in such a system are as follows, it being understood that the process could be CMOS or not and illustratively is:
1. grow thin oxide on silicon substrate;
2. deposit and dope Poly I;
3. oxidize, mask and etch Poly I;
4. grow thin oxide on silicon substrate for Poly II gate oxide and on sides of Poly I electrodes;
5. deposit, dope and oxidize Poly II;
6. mask and etch Poly II, leaving some gate oxide in the active area regions;
7. implant source and drain impurities and heat drive;
8. mask and etch contact windows to Poly I and Poly II but not source/drain regions;
9. deposit nitride layer;
10. deposit BPSG (density and reflow BPSG);
11. mask contact windows to poly I and poly II gate electrodes and source/drain regions;
12. etch through BPSG to nitride layer;
13. (density and reflow BPSG;)
14. etch through nitride layer and underlying oxide to source/drain regions, and Poly I and Poly II gate electrodes;
15. add metal or other conductive material for interconnects.

In the illustrative embodiments supra, self-aligned contacts could be made to individual poly levels (poly I or poly II), or to both levels simultaneously. Self-aligned contacts will be made to a given poly level, provided that a thick oxide is fabricated on top of that level. In all of the illustrative embodiments, self-aligned contacts would be made to an underlying field oxide, provided that oxide had a substantially vertical sidewall. With this invention, it is possible simultaneously to make contacts self-aligned to field oxide edges, field-shield electrode edges, and gate electrode edges, regardless of whether the poly edges are polycide structures, or use advanced transistor structures such as LDDs, and regardless of the type of gate dielectric used. In addition, provided an etch of sufficient selectivity (BPSG to nitride) is available, self-aligned contacts can be made whether the interlevel dielectric is reflowed prior to or subsequent to the contact window etch.

In the illustrative embodiments supra, oxide 24b in FIG. 3 is the oxide remaining in the active area after the poly etch. It will be understood that a poly etch which leaves sufficient oxide in the active areas for use as a screen oxide of the subsequent implantation steps is not required for this invention, but is used in the illustrative embodiments merely as an example. If such an etch is not available, and implantation into bare silicon is not desired, a thin screen oxide can be grown after the poly layer is defined. This in no way affects the self-aligned contact process. In some cases, the thickness of such an oxide could be limited due to the use of a polycide gate structure where little oxidation could be tolerated, or by the use of a particular grate electrode structure such as an LDD.

The present invention is useful in double poly processes using field-shield and silicde. FIG. 10A is a plan view of a structure made with such a process and can be referred to for further appreciation of the design rule problem with positioning contact windows in a high density integrated circuit. This figure illustrates, in plan view, some elements of a high density DRAM not using standard LOCOS isolation, but using a double poly fieldshield structure. A field-shield is very useful for high density structures and is taught more particularly in the patent application of Inmos Corporation in the name of S. Eaton et al., entitled "Thick Oxide Field-Shield Process" having U.S. Ser. No. 574,056 filed Jan. 26, 1985, U.S. Pat. No. 4,570,331, which as mentioned is incorporated by reference. Basically, a relatively thick oxide field-shield transistor isolates adjacent memory cells by using thick oxide between them with Poly I over the oxide. The Poly I there serves as a gate electrode which is usually connected so that transistor between cells would be off. (It will be understood that the invention does apply to LOCOS structures and others.).

Figure 10B:
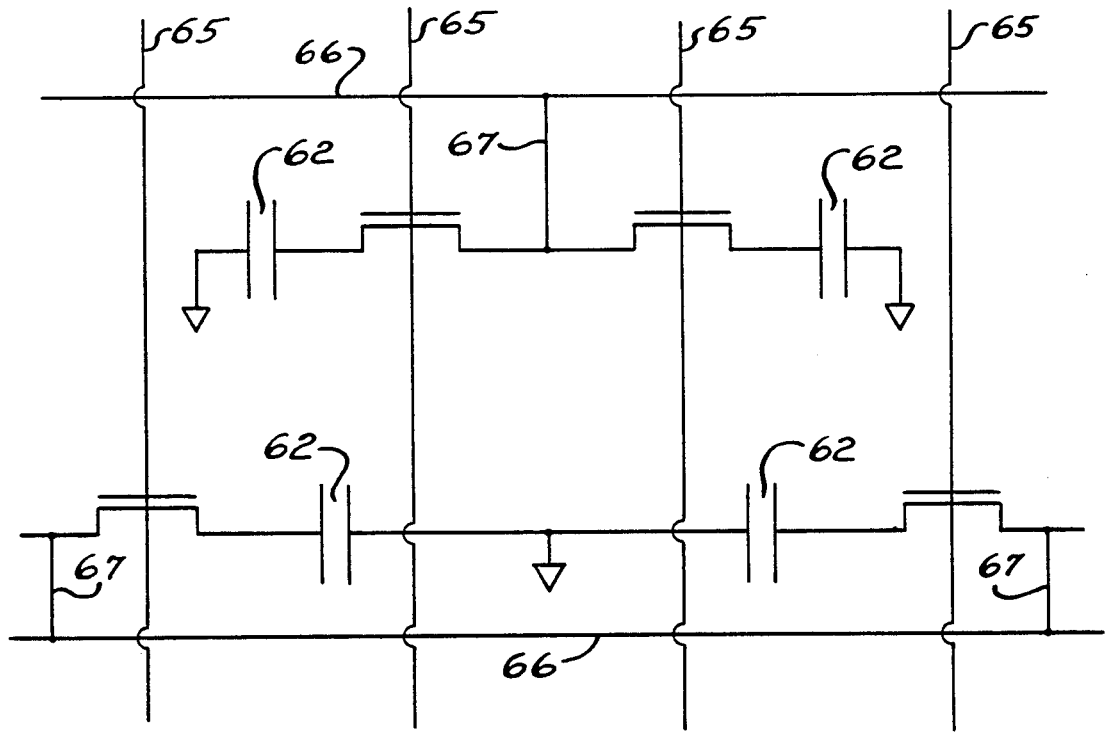
FIG. 10B is a schematic circuit diagram of FIG. 10A.

FIG. 10A shows parts of four cell capacitors 62, each having six sides. Each cell capacitor includes two separated plates. One of the capacitor plates is a doped region in the silicon substrate. The other plate is formed in a layer 63 of Poly I, which is also used for the field-shield. It is to be understood that layer 63 covers substantially the entire depicted area, but for clarity this layer is represented by a reference numeral 63 without showing the layer itself, which would otherwise obscure the entire figure. There are openings 64 (illustrated as a solid line forming an irregular eight-sided figure) in layer 63. Openings 64 define poly active area, and word lines 65 formed of Poly II pass over the active areas 64 to form gate electrodes there. Preferably, word lines 65 are polycide, i.e., polysilicon with a silicide thereover. Two metal bit lines to be situated above all of these elements are represented by dotted lines 66 which extend cross-wise with respect to word lines 65. A circuit diagram corresponding to FIG. 10A is shown as FIG. 10B.

Within each active area 64 is a contact window 67 which, when filled with a conductor such as metal, makes a contact providing electrical communication between bit lines 66 and the source or drain region in the active area 64. Normally, each opening 64 exposes only gate oxide. Each contact window 67 in area 64 provides an opening through the gate oxides to lay bare a part of the underlying source/drain region formed in the substrate. Typically contact window 67 is between 1.0 and 2.0 microns wide.

It can be seen in FIG. 10A that the cell capacitors 62 are very close to one another, making efficient use of silicon area. The relative sizes are approximately as follows. The contact windows 67 are 1.25 by 1.5 microns in width and height, poly lines 65 are about 2.0 microns wide, metal bit lines 66 are about 2.4 microns wide, and cell capacitor plates 62 are about 4.1 by 5.5 microns in width and height. Less than 1.1 microns separate contact windows 67 and from poly lines 65. Contact window 67 itself has tolerances in its dimension and may be 0.5 microns larger. High density structures can oridinarily be fabricated only if the contacts are properly located. If a contact window 67 inadvertently contacted a word line 65, then the corresponding bit line 66 would be shorted to the word line 65, and the cell will be inoperable. Similarly, the bit lines 66 must not contact the Poly I field-shield 63 through window 67.

Figure 10C:
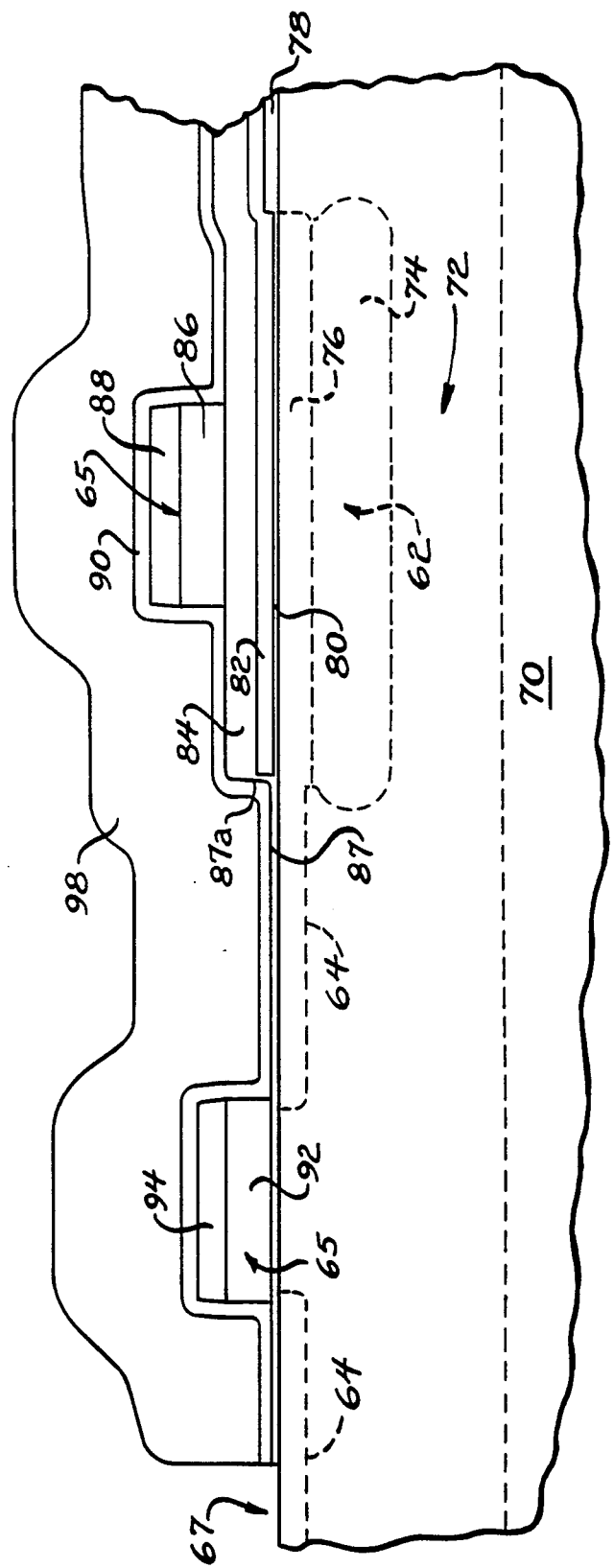
FIG. 10C is a sectional view along lines B—B of FIG. 10A.

FIG. 10C is a sectional view in expanded scale along lines B—B of FIG. 10A. This enlarged portion shows a memory cell in cross-section. A substrate 70 is P type silicon. Above it is a field-shield boron implant 72 to adjust the threshold voltage of the field-shield transistor and the active N-channel transistor. Boron and arsenic implants 74 and 76 for the lower capacitor plate 62 are within the field-shield implant. At the right side of FIG. 10C is shown a field-shield dielectric 78. It is thicker than a cell oxide 80 over arsenic implant 76. A layer 82 of poly I illustratively 1500 angstroms thick is above the oxides 78, 80. (It will be understood that the polysilicon over field-shield dielectric 78 operates as a gate electrode of a transistor which, as a feature of using field-shield, is always off.) Above the poly I is interpoly oxide 84 which is illustratively 3000 angstroms thick. Word line 65 is made of "polycide," having a lower portion 86 of poly II and an upper portion 88 of a silicide. Word line 65 is on top of oxide 84. It will be noted that there is an oxide 87a on the sidewall of polysilicon element 82 (a field-shield gate electrode). Oxide 87a, illustratively 500A thick, is grown as an insulator to separate element 82 from element 65 elsewhere in the circuit of FIG. 10A (e.g., where element 65 crosses the edge of element 64). This oxide 87a is grown during the growth of oxide 87 which is the gate oxide for the transistor formed by polycide element 65. It is not required for the self-aligned contact process but is required for the double poly process, as explained supra. A layer 90 of nitride covers the upper parts of word line 65 and the oxide 84 not otherwise covered by the word line.

On the left side of FIG. 10C is another polycide line 65 having a poly II portion 92 covered by a silicide portion 94. To the left of this is contact window 67. N-type source/drain implant 64 surrounds polycide gate electrode 65. Interlevel dielectric 98 (BPSG) is on top of the nitride layer 90.

Figure 10D:
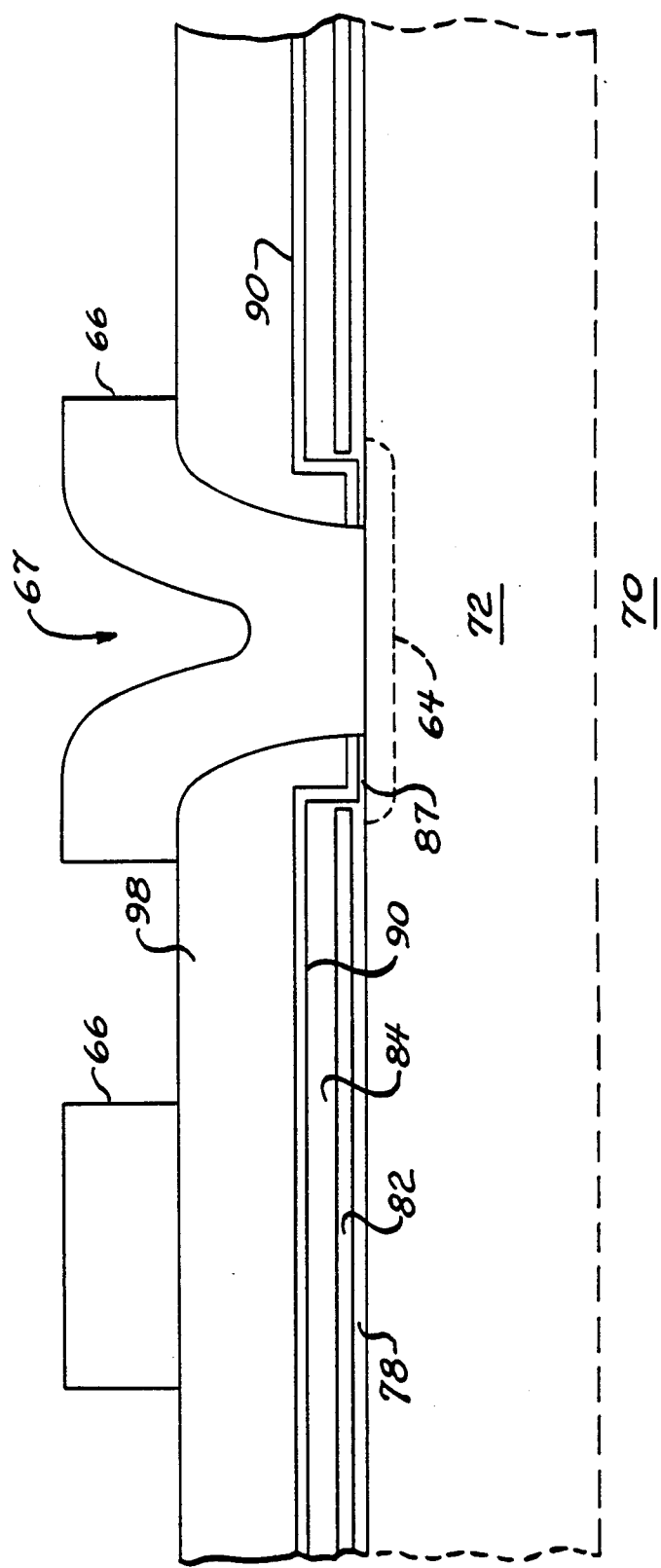
FIG. 10D is a sectional view along lines C—C of FIG. 10A.

A sectional view perpendicular to the section of FIG. 10C is shown in FIG. 10D, taken along lines C—C of FIG. 10a. This shows the Poly I with respect to which contact window 67 is positioned properly. As can be seen, bit line 66 extends through the window and nitride 90 to contact the source/drain region 64.

Figure 10E:
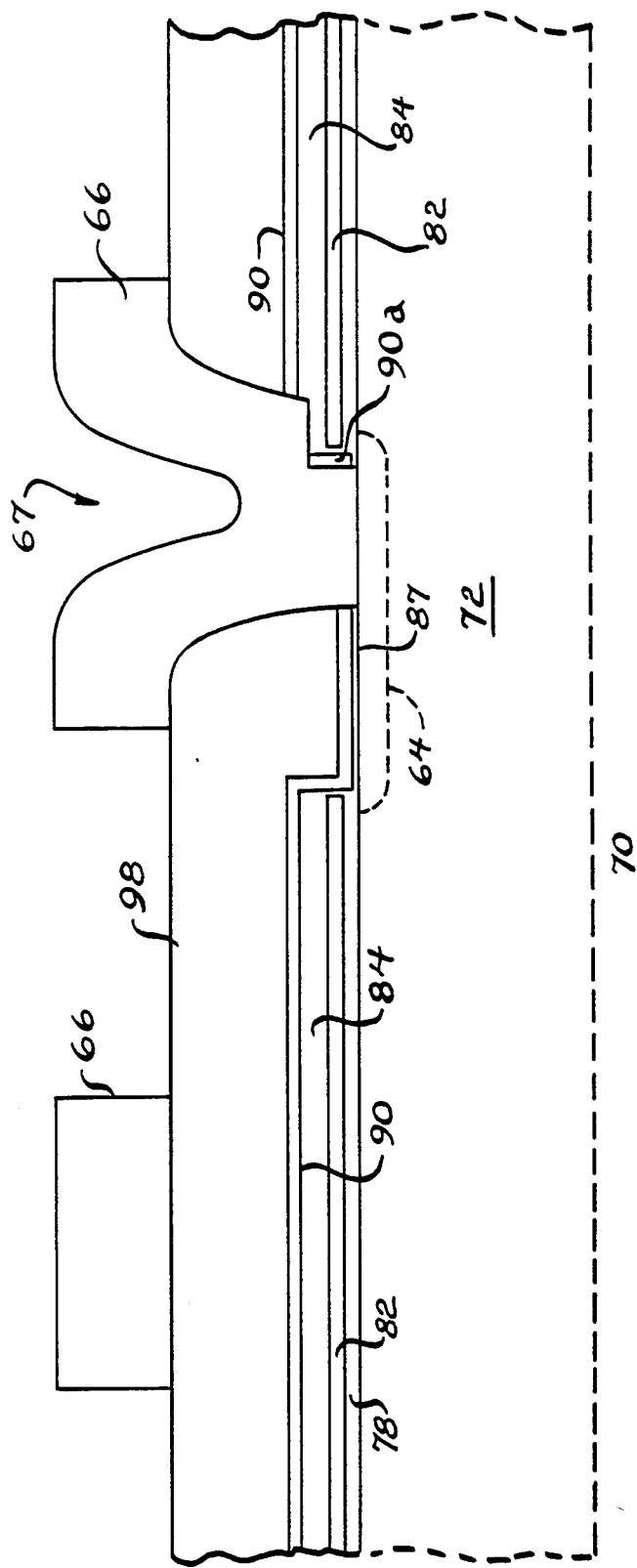
FIG. 10E is a sectional view similar to FIG. 10D but with the contact window misaligned toward the edge of the source/drain region.

Use of the present invention is further illustrated in FIG. 10E where a cross-sectional view similar to FIG. 10D is shown. In FIG. 10E, contact 67 is misaligned to the right toward the edge of field shield electrode 82. The "stick" of silicon nitride 90a remains on the side of electrode 82, protecting it from bit line 66. Some of oxide 84 remains on top of electrode 82, protecting it from bit line 66. In this manner, contact will be made to the source/drain region 64 without shorting to either the top or side of electrode 82 despite the misalignment.

Using this invention in the context of the technology of FIGS. 10A-10D permits aligning the contact window 67 with respect to polycide lines 65 and self-aligning with respect to the edges (64) of poly I element 63. It will be noted that the polycide lines illustratively have no oxide on top. If they were to have significant oxide on top of them, then there could be self-alignment to both poly I and poly II.

FURTHER FEATURES OF THE INVENTION

Another advantage of the present invention relates to contact resistance. It is important to have a low resistance between the aluminum contact and the source or drain region. Consequently, contact enhancement doping is generally done in n channel processes to lower the resistance of a source or drain contact. This can be done by ion implantation or diffusion into the contact window immediately after the window is etched open. Ordinarily, diffusion cannot be done on high density CMOS parts because the benefits of diffusion to the N channel devices would be harmful to the P channel devices. Photoresist cannot be used as a mask at the required temperatures, and consequently ion implantation is required in CMOS. The disadvantage, however, is that ion implantation is expensive and time-consuming at the dosage level required, and two additional masking steps are required.

Figure 1A:
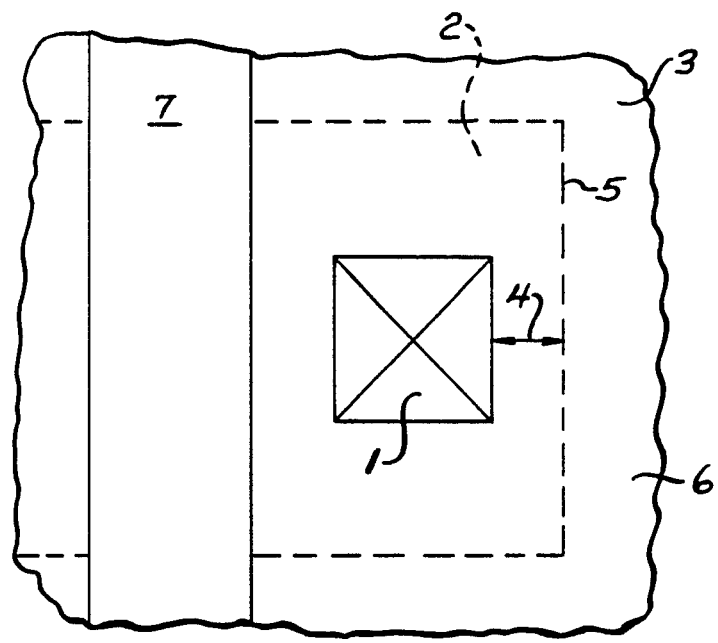
FIG. 1A is a sketch showing a contact window on an active area near an isolation edge and a gate electrode and is helpful in understanding one of the problems solved by the present invention.
Figure 1B:
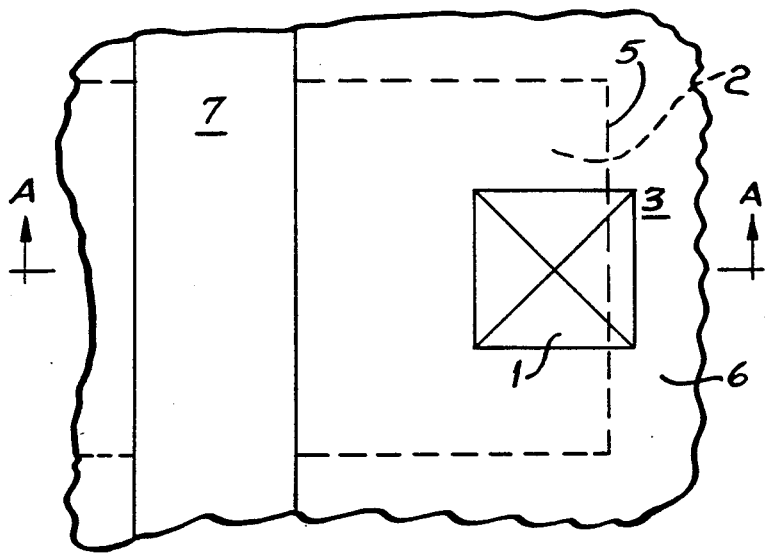
FIG. 1B is similar to FIG. 1A but shows a misaligned contact window.
Figures 1C, 1D:
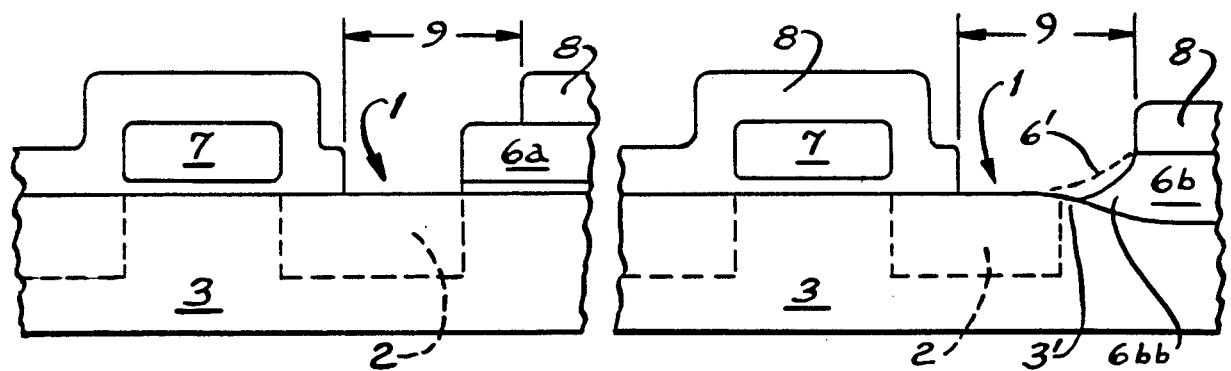
FIGS. 1C and 1D are cross-sectional views along lines A—A of FIG. 1B.

Contact enhancement implants serve two purposes. First, they provide added dopant to the source/drain regions when the dopant contributed by the source/drain implants is inadequate to produce the required contact resistance. Second, they provide dopant when a situation such as that shown in FIG. 1D occurs, i.e., an area of undoped substrate is exposed to the metalization. In such a case the contact enhancement implant prevents the undesired short, but at the expense of a masking step and an implant.

With the present invention, both of these problems are forestalled. An important aspect of the invention is that the source and drain implants are protected from outdiffusion in subsequent thermal steps by the etch stop. The source/drain implants themselves, when so preserved, yield low enough contact resistance for good circuit performance. In addition, since substantially vertical gate electrode edges and field oxide edges are employed by the process and a "stick" of etch stop layer is left on the sidewall of the gate electrodes, it is not possible to expose undoped substrate during the etch process. Thus, the use of layer 10 in the manner described supra is found to be advantageous in providing low resistance ohmic contacts without the need for contact enhancements.

The present invention will find many applications and provide corresponding advantages. The descriptions given here are intended to be illustrative of how the etch stop is used. Persons skilled in the art will find alternative ways of practicing the invention which is defined by the appended claims.

I claim:

1. A process of fabricating a contact window in a semiconductor structure with a substrate, intermediate and upper conducting or semiconducting levels, and an interlevel dielectric, the process comprising the steps of:
   fabricating a partially complete structure having a substrate and an intermediate level;
   establishing an etch stop on exposed top and sidewall surfaces of said partially complete structure; and
   adding the interlevel dielectric;
   positioning contact window locations;
   etching through said interlevel dielectric at said contact window locations to said etch stop;
   etching anisotropically at said contact window locations through said etch stop and underlying insulation to expose an area to which contact is to be made but not entirely through insulation covering an element to which contact is not to be made at the contact window and leaving etch stop on said sidewall surfaces thereof so that the contact window can partially overlie a member to which electrical contact is not to be made without causing the circuit being formed to be inoperable.

2. The process of claim 1 wherein said fabricating step includes providing a dielectric over elements formed from an intermediate level, which dielectric takes longer to etch through entirely than dielectric covering the area to which contact is to be made via the contact window.

3. The process of claim 1 wherein a contact window is to be made for contact to a source or drain region, wherein the process includes:
   depositing a polysilicon layer over the substrate and a gate dielectric;
   defining poly elements in said polysilicon layer;
   providing a dielectric over said poly elements which takes longer to etch through than dielectric, if any, over the source or drain region to which contact is to be made;
   establishing said etch stop over said dielectric or over field oxide at least in the region where said contact window will be located: then
   adding said interlevel dielectric over the semiconductor structure;
   masking said interlevel dielectric where the contact window is to be formed; then
   performing said etching steps.

4. The process of claim 3 wherein said etch stop comprises a layer of material over the top and side of said partially complete structure.

5. The process of claim 4 wherein said etch stop comprises a layer of silicon nitride.

6. The process of claim 4 wherein said etch stop comprises a dielectric and said etching steps are selective for said dielectric.

7. The process of claim 5 wherein said first-named etching uses an etchant which has a high selectively of oxide to nitride.

8. A process of fabricating a contact window in a semiconductor structure with a substrate, and intermediate and upper conducting or semiconducting levels separated by an interlevel dielectric, the process comprising the steps of:
   fabricating a partially complete structure having a substrate and an intermediate level;
   establishing an etch stop on parts of said intermediate layer of said partially complete structure, which parts are to be protected from contact window etching of subsequent steps;
   adding the interlevel dielectric over said partially complete structure and etch stop thereon;
   positioning contact window locations; and
   etching through said interlevel dielectric surface to which contact is to be made, said etch stop preventing etchant from reaching selected parts of said intermediate layer.

9. In a process for forming contacts in a semiconductor structure having a substrate, an intermediate level, and relatively thick interlevel dielectric, the improvement comprising:
   establishing an etch stop layer beneath the interlevel dielectric, the etch stop layer covering areas where contact windows are to be made;

positioning contact window locations; and etching at the contact window locations to the etch stop, then etching through the etch stop and underlying materials to open the contact window, leaving etch stop on sidewall surfaces of a member to be protected, whereby the contact window can be self-aligned.

10. The improvement of claim 9 wherein said process includes establishing a contact window in a high density semiconductor device having a relatively conductive word line to which contact is not to be made at the contact window and a relatively conductive field-shield edge to which contact is not to be made, said field-shield being covered by a dielectric, the improvement further comprising aligning the contact window to the word line and self-aligning the contact window to the field-shield edge.

* * * * *

UNITED STATES PATENT AND TRADEMARK OFFICE
CERTIFICATE OF CORRECTION

PATENT NO. : 4,686,000
DATED : August 11, 1987
INVENTOR(S) : Barbara A. Heath

It is certified that error appears in the above-identified patent and that said Letters Patent is hereby corrected as shown below:

On the title page insert assignee

--INMOS Corporation, Colorado Springs, Colorado --.

On the title page insert -- Attorney, Agent or Firm Edward D. Manzo --.

Column 11, line 42, "density" should be -- densify --.

Column 15, line 62, "and" should be -- then --.

Column 16, line 42, "selectively" should be --selectivity--.

Signed and Sealed this

Second Day of February, 1988

Attest:

DONALD J. QUIGG

*Attesting Officer*     *Commissioner of Patents and Trademarks*